United States Patent [19]

Kung et al.

[11] Patent Number: 5,680,281
[45] Date of Patent: Oct. 21, 1997

[54] EDGE-BIASED MAGNETORESISTIVE SENSOR

[75] Inventors: Kenneth Ting-Yuan Kung; Po-Kang Wang, both of San Jose, Calif.

[73] Assignee: International Business Machines Corporation, Armonk, N.Y.

[21] Appl. No.: 482,898

[22] Filed: Jun. 7, 1995

Related U.S. Application Data

[63] Continuation of Ser. No. 209,088, Mar. 10, 1994, abandoned.

[51] Int. Cl.[6] ............................................. G11B 5/33
[52] U.S. Cl. ............................................. 360/113
[58] Field of Search ............................ 360/113, 110, 360/119, 120, 122, 125, 126; 29/603, 603.01, 603.07, 603.08; 338/32 R, 32 H; 324/252, 207.21

[56] References Cited

U.S. PATENT DOCUMENTS

| | | | |
|---|---|---|---|
| 4,103,315 | 7/1978 | Hempstead et al. | 360/110 |
| 4,663,683 | 5/1987 | Youda et al. | 360/113 |
| 4,663,685 | 5/1987 | Tsang | 360/113 |
| 4,785,366 | 11/1988 | Krounbi et al. | 360/113 |
| 4,841,398 | 6/1989 | Mowry | 360/113 |
| 5,159,513 | 10/1992 | Dieny et al. | 360/113 |
| 5,287,238 | 2/1994 | Baumgart et al. | 360/113 |
| 5,325,253 | 6/1994 | Chen et al. | 360/113 |
| 5,343,422 | 8/1994 | Kung et al. | 360/113 |
| 5,380,548 | 1/1995 | Lin et al. | 427/130 |

FOREIGN PATENT DOCUMENTS

| | | | |
|---|---|---|---|
| 1-133213 | 5/1989 | Japan | 360/113 |
| 2016788 | 9/1979 | United Kingdom | 360/113 |

OTHER PUBLICATIONS

IEEE Trans. on Magnetics, vol. MAG16, No. 5, Sep. 1980, Decker et al, pp. 643–645.

C. Tsang, "Magnetics of small magnetoresistive sensors", J. Appl. Phys. 55(6), Mar. 1984, pp. 2226–2231.

*Primary Examiner*—John H. Wolff
*Assistant Examiner*—David L. Ometz
*Attorney, Agent, or Firm*—Leslie G. Murray; Paik Saber

[57] ABSTRACT

A magnetoresistive (MR) sensor comprising a layer of ferromagnetic material forming an MR sensing element wherein the MR sensor is biased by utilizing only the MR stripe uniaxial anisotropy and the shape anisotropy of the active region of the sensing element. The active region of the MR element has a generally square geometry to provide the desired shape anisotropy. The MR sensor is biased at approximately 45 degrees by defining the magnetization at the four edges of the sense element active region utilizing its shape anisotropy and canting the magnetic easy axis at an appropriate angle during fabrication of the MR sensor. To minimize Barkhausen noise, a single magnetic domain configuration is achieved by reducing the sensor active region dimensions, i.e., stripe height and track width, to less than the characteristic domain wall thickness such that the formation of multiple magnetic domains is no longer energetically favorable. A magnetic biasing material such as a layer of antiferromagnetic material to provide exchange coupling, can be provided at a pair of opposing edges to maintain the magnetization at the edges in the desired orientation and to stabilize the sensor.

30 Claims, 5 Drawing Sheets

Magnetics of an Edge-Biased MR Sensor

Domain Wall Thickness vs NiFe Film Thickness, based on Middlechoek

| Recording Density (Gb/in$^2$) | MR Thickness (Å) | Neel Wall Thickness (μm) | Stripe Height (μm) | Track Width (μm) |
|---|---|---|---|---|
| 1 | 150 | 1.0 | 0.8 | 1.2 |
| 2 | 120 | 1.2 | 0.6 | 1.0 |
| 5 | 90 | 1.3 | 0.4 | 0.8 |

EDGE-BIASED MAGNETORESISTIVE SENSOR

This is a continuation of application Ser. No. 08/209,088, filed on Mar. 10, 1994, now abandoned.

BACKGROUND OF THE INVENTION

The present invention relates generally to magnetoresistive (MR) read sensors for use in thin film magnetic heads for reading data from magnetic storage devices and, more particularly, to an MR read sensor which utilizes shape anisotropy and predefines the magnetization of the MR sensing element edges and in which the MR sensing element magnetic easy axis is canted at a preselected angle during fabrication for obtaining a symmetric and linear output.

A general description of the principle of operation of MR sensors in magnetic recording systems is provided by Tsang in "Magnetics of Small Magnetoresistive Sensors", *Journal of Applied Physics*, Vol. 55(6), Mar. 15, 1984, pp. 2226–2231. Essentially, an MR sensor detects magnetic field signals through the resistance changes of the magnetoresistive read element as a function of the amount and direction of magnetic flux being sensed by the element. MR sensors are of interest for three primary reasons: the voltage output when detecting recorded flux transitions in a magnetic medium is large and proportional to an applied sense current; good linear density resolution can be obtained; and the MR sensor output is independent of the relative velocity between sensor and medium.

MR sensors typically comprise a thin strip of a ferromagnetic material, such as a nickel-iron (NiFe) alloy, for example, magnetized along a magnetic easy axis of low coercivity. The MR strip, sometimes referred to as a stripe, is usually mounted in a magnetic transducer or head such that the easy axis is transverse to the direction of rotation of a magnetic disk recording medium and parallel to the plane of the disk. The magnetic flux from the disk associated with a stored data bit causes rotation of the magnetization vector of the MR strip, which in turn causes a change in resistivity of the MR material. This change in resistivity is sensed by a current flowing through the MR strip between lateral contacts. The resistivity varies approximately according to the cosine-squared of the angle between the magnetization vector and the current vector. Due to this cosine-squared relationship, if the magnetization and current vectors are initially aligned, the initial change in resistivity due to the disk magnetic flux is low and unidirectional. Typically, therefore, either the easy axis magnetization vector or the current vector is biased to approximately 45 degrees to increase responsiveness to angular change in the magnetization and to linearize the sensor output.

It is well known in the prior art that in order for an MR sensor to operate optimally, two bias fields are required. As described above, to bias the MR sensing element so that its response to a magnetic flux field is linear, a transverse bias field is generally provided. This bias field is normal to the plane of the magnetic media and parallel to the surface of the planar MR element. The second bias field which is typically utilized with MR elements is referred to as the longitudinal bias field and extends parallel to the surface of the magnetic media and parallel to the lengthwise direction of the MR element. The primary purpose of the longitudinal bias is to suppress Barkhausen noise caused by the irreversible motion of magnetic domains in the presence of an applied field, i.e., coherent rotation of the magnetization vector is non-uniform and suppressed, and depends upon domain wall motion. The longitudinal bias field maintains a single magnetic domain in the active region of the MR sensing element which eliminates this noise mechanism. A secondary purpose of the longitudinal bias field is to improve the magnetic stability in the presence of high magnetic field excitation. The longitudinal bias field typically is provided by either hard-magnet or antiferromagnetic/ferromagnetic exchange-coupled biasing.

Typically, the transverse bias field is provided by a current flow through a layer of soft magnetic material deposited adjacent to the MR element and separated by a thin magnetically isolating layer. This method of providing the transverse bias field has a major drawback in that a significant portion of the MR element sense current is shunted through the conducting layers adjacent to the sensor element. The result is a reduced overall magnetoresistance (deltaR/R) and thus a reduced sensitivity. Another method of setting the angle between the sense current and the easy axis magnetization vector, referred to as a "barber pole", utilizes conductive stripes formed across the MR strip canted with respect to the easy axis thereby canting the direction of the current vector relative to the easy axis magnetic vector. However, while there is no shunting of the sense current, the barber pole design has the disadvantage that the effective length of the MR sensor element is less than the longitudinal distance between the sensor lead contacts. The barber pole design also requires precise lithographic processes to form the canted conductive stripes.

U.S. Pat. No. 4,841,398 entitled "NON LINEAR MAGNETORESISTIVE SENSOR" issued to Greg S. Mowry discloses an MR sensor having a shaped sensing element which provides a stable single domain in the central active region. In one preferred embodiment, no transverse bias is utilized thus eliminating the barber pole configuration to provide an MR sensor in which the sense element magnetization vector is parallel to the sense current vector and operates in a non-linear response mode. In another embodiment, canted electrical contacts or leads connected to the sense element at the ends of its central active region cant the direction of the sense current vector to provide linear operation of the sensor. Alternatively, Mowry discloses shaping the sense element to provide a canted magnetic easy axis in combination with canted electrical leads to provide linear operation.

SUMMARY OF THE INVENTION

It is therefore a primary object of the present invention to provide a magnetoresistive (MR) read sensor having improved sensitivity.

It is another object of the present invention to provide an MR read sensor in which the transverse bias layer and its magnetic isolation layer are not required for stable, linear operation of the MR sensor.

In accordance with the principles of the present invention an MR read sensor comprises a layer of magnetoresistive material forming an MR sensing element wherein the MR sensor is biased by utilizing only the MR stripe uniaxial anisotropy and the shape anisotropy of the active region of the sensing element. The active region of the MR element has a generally square geometry to provide the desired shape anisotropy. The MR sensor is biased at approximately 45 degrees by defining the magnetization at the four edges of the sense element active region utilizing its shape anisotropy and canting the magnetic easy axis at an appropriate angle during fabrication of the MR sensor. To minimize Barkhausen noise, a single magnetic domain configuration is achieved by reducing the sensor active region dimensions, i.e., stripe height and track width, to less than the characteristic domain wall thickness such that the formation of multiple magnetic domains is no longer energetically favorable.

In the MR sensor of the present invention, proper biasing for obtaining symmetric and linear response is achieved without the use of current shunting transverse bias layers. Thus, the full sense current is directed through the MR sensing element and maximum sensitivity for the MR sensor is obtained.

BRIEF DESCRIPTION OF THE DRAWINGS

The foregoing and other objects, features and advantages of the present invention will be apparent from the following detailed description of the preferred embodiments of the invention, reference being made to the accompanying drawings, in which like reference numerals indicate like parts and in which.

DETAILED DESCRIPTION OF THE PREFERRED EMBODIMENTS

Figure 1:
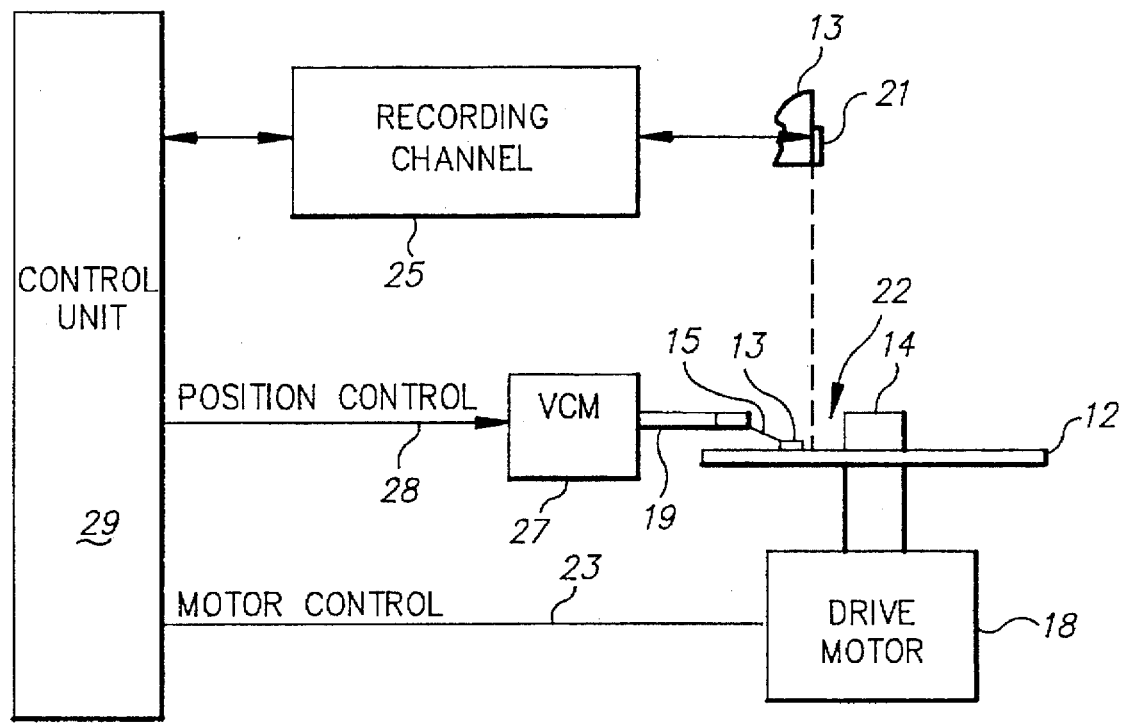
FIG. 1 is a simplified block diagram of a magnetic disk storage system embodying the present invention.

Referring now to FIG. 1, although the invention is described as embodied in a magnetic disk storage system as shown in FIG. 1, it will be apparent that the invention is also applicable to other magnetic recording systems such as a magnetic tape recording system, for example. At least one rotatable magnetic disk 12 is supported on a spindle 14 and rotated by a disk drive motor 18. The magnetic recording media on each disk is in the form of an annular pattern of concentric data tracks (not shown) on disk 12.

At least one slider 13 is positioned on the disk 12, each slider 13 supporting one or more magnetic read/write transducers 21, typically referred to as read/write heads. As the disks rotate, the sliders 13 are moved radially in and out over the disk surface 22 so that the heads 21 may access different portions of the disk where desired data is recorded. Each slider 13 is attached to an actuator arm 19 by means of a suspension 15. The suspension 15 provides a slight spring force which biases the slider 13 against the disk surface 22. Each actuator arm 19 is attached to an actuator means 27. The actuator means as shown in FIG. 1 may be a voice coil motor (VCM), for example. The VCM comprises a coil moveable within a fixed magnetic field, the direction and velocity of the coil movements being controlled by the motor current signals supplied by a controller.

During operation of the disk storage system, the rotation of the disk 12 generates an air bearing between the slider 13 and the disk surface 22 which exerts an upward force on the slider. The air bearing thus counterbalances the slight spring force of the suspension 15 and supports the slider 13 off and slightly above the disk surface by a small, substantially constant spacing during operation.

The various components of the disk storage system are controlled in operation by control signals generated by control unit 29, such as access control signals and internal clock signals. Typically, the control unit 29 comprises logic control circuits, storage means and a microprocessor, for example. The control unit 29 generates control signals to control various system operations such as drive motor control signals on line 23 and head position and seek control signals on line 28. The control signals on line 28 provide the desired current profiles to optimally move and position a selected slider 13 to the desired data track on the associated disk 12. Read and write signals are communicated to and from read/write heads 21 by means of recording channel 25.

The above description of a typical magnetic disk storage system, and the accompanying illustration in FIG. 1 are for representation purposes only. It should be apparent that disk storage systems may contain a large number of disks and actuators, and each actuator may support a number of sliders.

Figure 2:
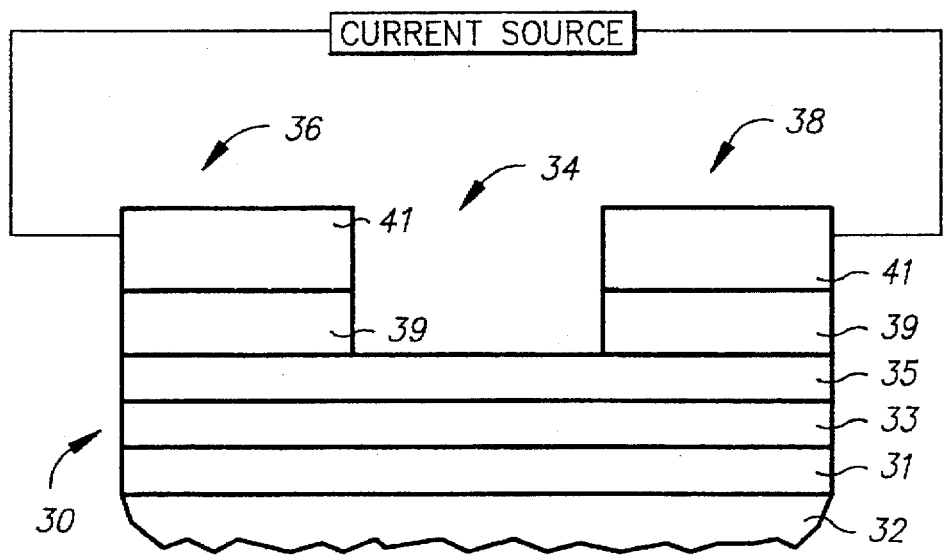
FIG. 2 is a schematic diagram illustrating the construction of a prior art thin film MR sensor.

Referring now also to FIG. 2, a prior art thin film MR sensor 30 of the type described in U.S. Pat. No. 4,663,685, for example, comprises a central active region 34 separating passive end regions 36 and 38. A layer of soft magnetic material is deposited on substrate 32 forming transverse bias layer 31. A spacer layer 33, an MR layer 35 and an antiferromagnetic layer 39 are successively deposited over the transverse bias layer 31, the antiferromagnetic layer 39 being patterned to overlay and contact the MR layer 35 in the end regions 36 and 38 only. Electrical leads 41 are deposited to overlay and contact the MR layer only in the end regions 36 and 38. A current source 43 connected between conductor leads 36, 38 provides a sense current in the central region 34, a portion of which generates a transverse bias field for producing a linear response in the MR sensor. The MR layer 35, formed of a ferromagnetic material such as $Ni_{81}Fe_{19}$, for example, provides an output current which enables a separate sensing circuit in the recording channel 25 to determine resistance changes in the MR layer. The resistance changes are a function of changes in the magnetic fields intercepted by the MR layer 35 representative of recorded data on the magnetic storage medium 22.

In order to assure that the MR layer 35 has uniaxial anisotropy the antiferromagnetic layer 39 is formed on MR layer 35. The antiferromagnetic layer 39 comprises an antiferromagnetic theta-phase Mn alloy having an ordered CuAu—I type structure, i.e., a face-centered-tetragonal (fct) structure, preferably NiMn. The antiferromagnetic layer 39 creates an interface exchange coupling with the ferromagnetic MR layer 35. This results in a longitudinal exchange bias field ($H_{UA}$) in the MR layer and creates a single magnetic domain in the MR layer 35. The existence of a single magnetic domain state in the MR layer is essential to suppress Barkhausen noise which is associated with MR materials which exhibit multiple magnetic domain states.

The transverse bias layer 31 provides a magnetic field oriented generally perpendicular to the medium 22 so as to slightly bias the magnetic field in the MR layer 35 in a direction non-parallel to the medium 22. This transverse bias field maintains the MR layer 35 in a linear response mode such that the current output is essentially a linear function of the resistance changes. The transverse bias layer 31 is separated from the MR layer 35 by a thin non-magnetic spacer layer, such as tantalum (Ta), for example.

As described above, a portion of the sense current is shunted through the transverse bias layer 31 for the purpose of generating a transverse bias field for the MR sensor. Additionally, while the spacer layer 33 is typically of a relatively high resistivity material, such as a high resistivity phase of Ta, a portion of the sense current is also shunted through this spacer layer. Thus, only a portion of the sense current flows through the MR sense element 35 active region resulting in a lower output signal and reduced sensitivity.

Figure 3:
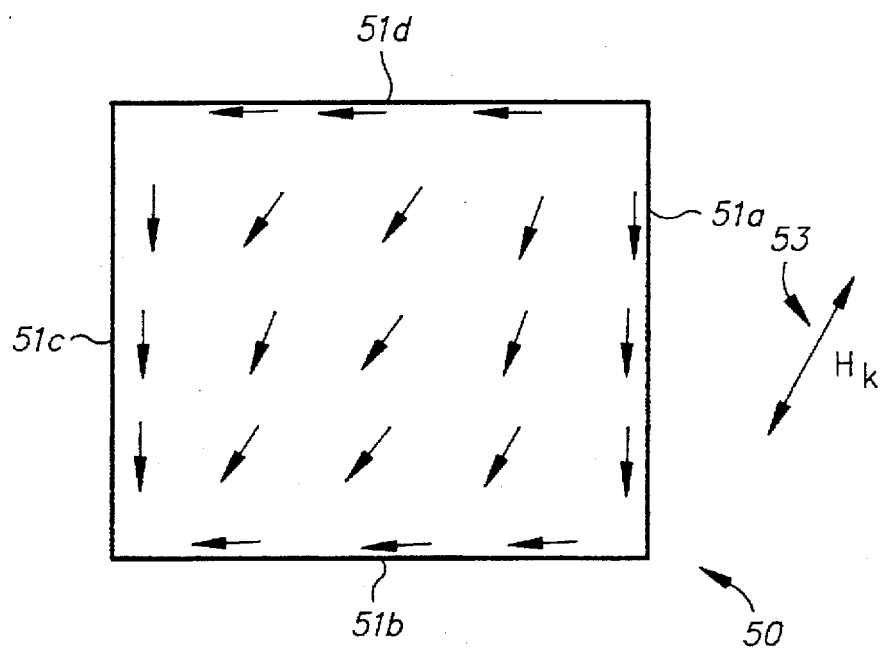
FIG. 3 is a diagram illustrating the magnetization of an MR sense element according to the principles of the present invention.
Figure 4:
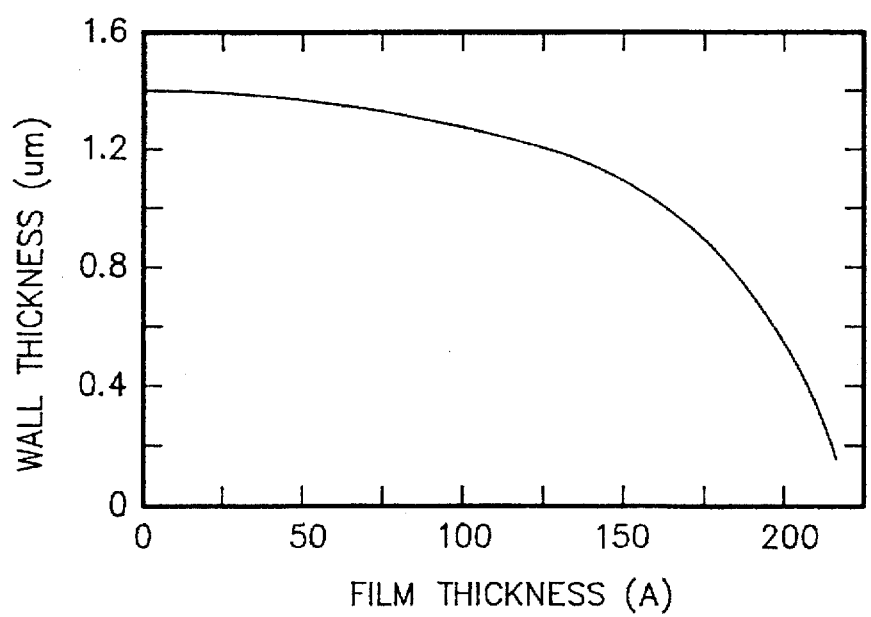
FIG. 4 is a graph illustrating the domain wall thickness as a function of NiFe layer thickness.
Figures 5, 8:
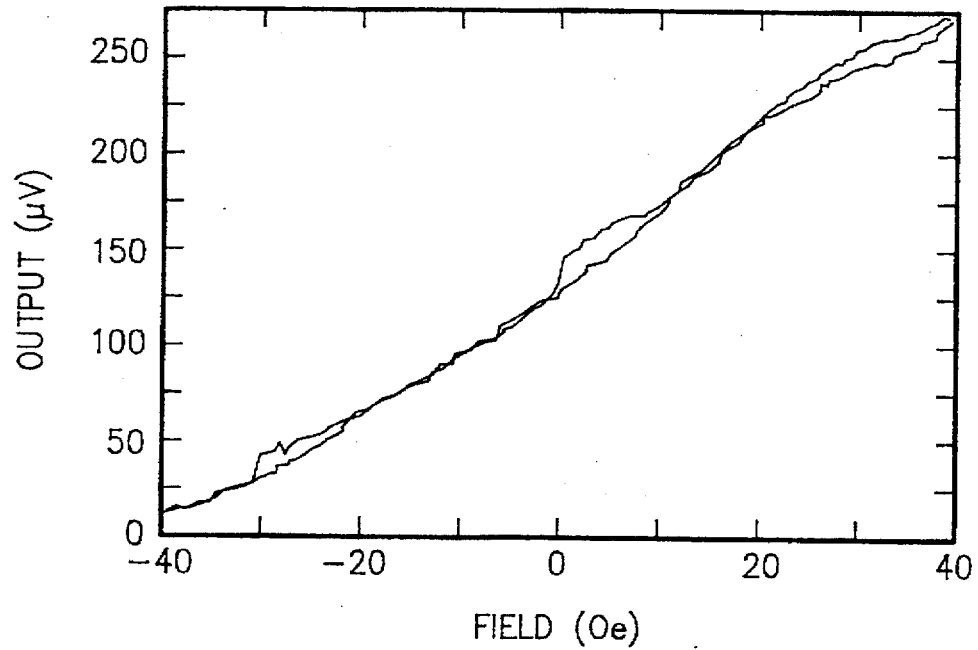
FIG. 5 is a table tabulating the geometric parameters for edge-biased MR sensors as a function of recording density.
FIG. 8 is a graph illustrating the response of an edge-biased MR sensor having a stripe height of 1.2 µm and a track width of 1.0 µm.

Referring now to FIGS. 3, 4 and 5, an edge-biased MR sensor according to the principles of the present invention is achieved by defining the magnetization at the edges of the active portion of an MR sensor together with the appropriate uniaxial anisotropy, $H_k$. FIG. 3 illustrates an edge-biased MR sensing element 50 having uniaxial anisotropy, $H_k$, as indicated by arrow 53 and a generally square geometry. For the MR sensor wherein the active region has a substantially square geometry, the resulting anisotropic field biases the MR sensor at approximately 45 degrees and the requirement for any additional magnetic layers to provide a transverse bias field in the sensor active region is eliminated. To increase the tendency for the anisotropic field to be oriented at 45 degrees or other preferred orientation, the magnetic easy axis of the MR sensing element 50 can also be set at 45 degrees with respect to the sensor longitudinal axis during the sensor fabrication. For example, after deposition, the MR sensing element 50 can be annealed in the presence of a magnetic field having the desired orientation or other suitable technique as is known in the art. Current shunting through the transverse bias layer 31 and the spacer layer 33 is thus also eliminated and full utilization of the MR sensor layer deltaR/R is realized.

Figure 10:
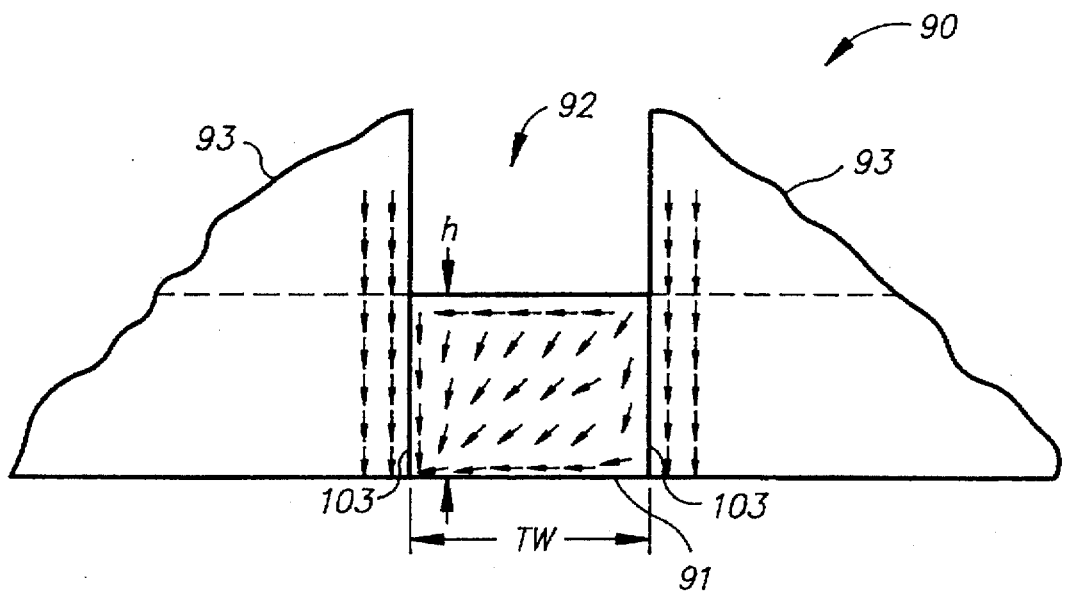
FIG. 10 is a top plan view illustrating the magnetization of the end and central regions of the MR sensor shown in FIG. 9.

To achieve a single magnetic domain configuration, the geometry (i.e., stripe height (h), track width (TW) as shown in FIG. 10) of the MR sensing element 50 is selected to be smaller than the characteristic domain wall thickness such that the formation of closure domains is not energetically favorable. In very thin films, e.g., films having a thickness less than about 200 Å, only Neel walls, in which the magnetic moments rotate within the plane of the film, are observed. FIG. 4 plots the Neel wall thickness versus NiFe film thickness for $Ni_{20}Fe_{80}$ alloy film, based on the calculations and measurements reported by S. Middlehoek, "Domain Walls in Thin Ni—Fe Films", *Journal of Applied Physics*, Apr. 1964, Vol. 34, No. 4, page 1054–1059. FIG. 5 compares MR sensor (active region) geometric parameters required for various data recording densities with Neel wall thickness as extracted from the data shown in FIG. 4. It is clear from FIG. 5 that as recording density increases, the MR sensor geometry is well within the Neel wall thickness.

Figure 6:
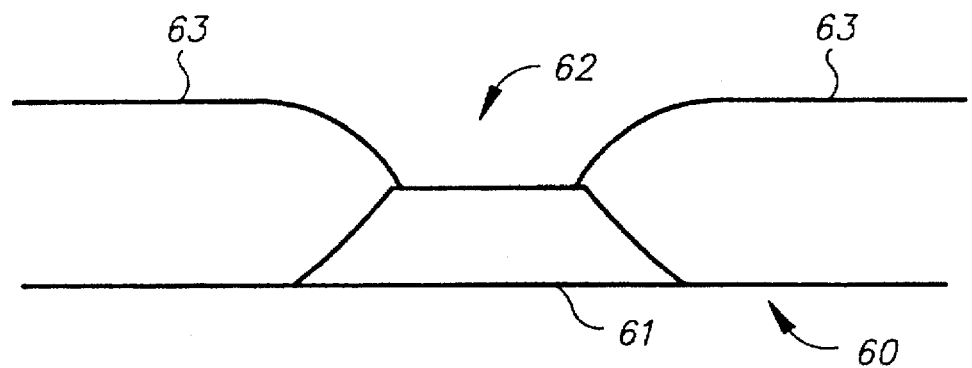
FIG. 6 is a diagram illustrating a preferred embodiment of an MR sensor according to the principles of the present invention.
Figure 7:
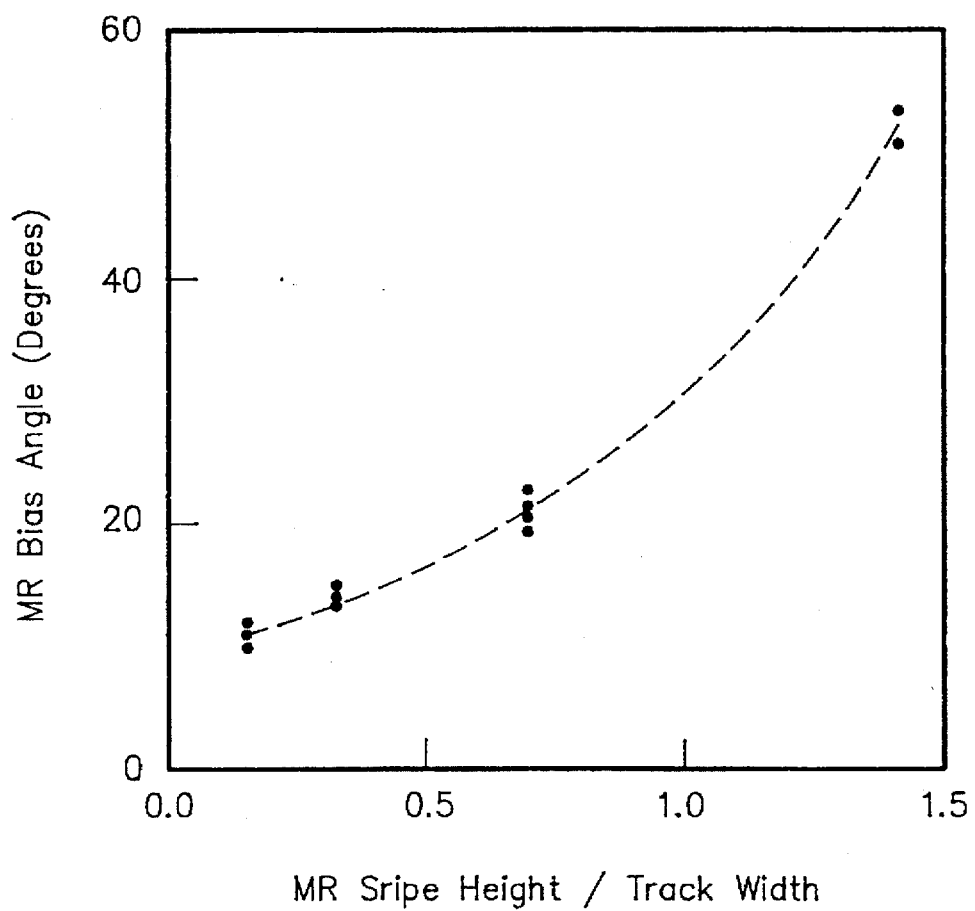
FIG. 7 is a graph illustrating the MR bias angle as function of the MR stripe geometric ratio for a sensor having a stripe height of 1.4 µm.

Referring now also to FIGS. 6, 7 and 8, a preferred embodiment of an MR sensor according to the present invention is illustrated. The MR sensor 60 comprises an MR layer 61 of ferromagnetic material and conductive leads 63 formed at either end of the MR layer. The active region 62 of the sensor is defined by the overlay of the conductive lead structures 63 on the MR layer 61. In this preferred embodiment, the MR layer 61 is a multilayer film having the structure Ta(50 Å)/NiFe(150 Å)/Ta(50 Å) where the Ta layers provide protection for the NiFe layer from corrosion and other undesirable effects of subsequent processing and use. However, as is known in the art, the MR sensing layer can be of any suitable ferromagnetic material such as Fe, Ni, Co or magnetic alloys thereof. Similarly, the conductive leads comprise a multilayer film having the structure Ta(200 Å)/AuNi(600 Å)/Ta(200 Å), but can be of any suitable conductive material, such as Au or Cu, for example. The dimensions of the MR layer active region 62 are chosen such that the MR layer magnetocrystalline anisotropy provides the desired bias field canted at approximately 45 degrees with respect to the longitudinal axis without the use of additional longitudinal or transverse bias mechanisms.

Magnetoresistive sensors having the structure illustrated in FIG. 6 with various dimensions were fabricated and tested to determine the effects of sensor geometry on domain stability and bias field angle. Wafer-level tests were performed on 2×4 matrices of shielded MR sensors having MR stripe heights of 1.4 and 2.3 μm, and track widths of 1.0, 2.0, 4.0 and 10 μm for a MR layer of NiFe with a thickness of 150 Å. FIG. 7 illustrates the bias field angle (with respect to the horizontal axis of the MR sensor 60) as a function of the ratio of the MR stripe height to the track width for sensors having an MR stripe height of 1.4 μm. As the sensor active region 62 becomes substantially square, i.e., as the track width is reduced from 10 to 1.0 μm, the sensor goes from being un-biased to a bias field angle of approximately 45 degrees. FIG. 7 also shows that the orientation of the bias field varies very rapidly with the geometric ratio of the MR sensor, particularly around the desired bias field angle of 45 degrees.

FIG. 8 plots the quasi-static response curve for a lapped, edge-biased MR sensor 60 with an MR stripe height of 1.2 μm, a track width of 1.0 μm and an MR layer thickness of 150 Å. The sense current applied to the MR sensor is 6 milliAmperes. The response is linear showing that the sensor is properly biased. The response curve also shows a small hysteresis in some portions of the curve indicating the possible existence of residual domain structures. To minimize hysteresis and improve the bias field stability, when the MR sensor active region dimensions are greater than the Neel wall thickness, as in the illustrated case, a weak longitudinal bias field may be provided in the active region 62 by including exchange bias or hard bias layers in the conductive lead region 61 of the sensor.

Figure 9:
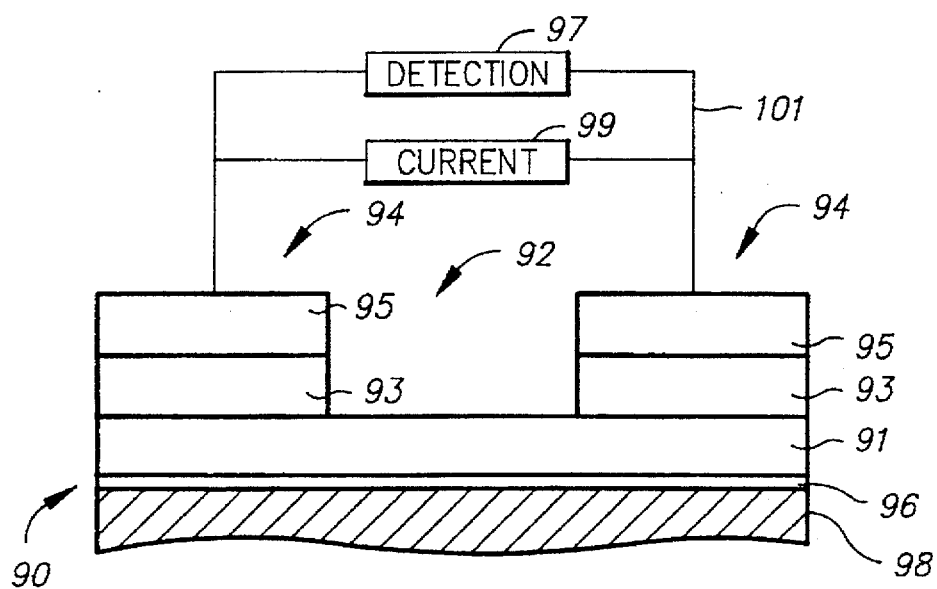
FIG. 9 is a cross-sectional view at the air bearing surface illustrating another preferred embodiment of the edge-biased MR sensor according to the principles of the present invention.

Referring now also to FIGS. 9 and 10, a second preferred embodiment of an edge-biased MR sensor according to the present invention is shown. The MR sensor 90 comprises an MR layer 91 of ferromagnetic material such as $Ni_{80}Fe_{20}$, for example, a pinning layer 93 of antiferromagnetic material such as MnFe or NiMn, for example, patterned to cover only the end or passive regions 94 of the MR sensor and conductive leads 95 of suitable conductive material such as Au or Cu, for example, formed over the pinning layer in the sensor end regions 94. Alternatively, the pinning layer 93 can be of a hard magnetic material such as CoNi, CoPt, or their alloys with Cr, for example. The MR sensor 90 is formed on a substrate 98 such as Si or ceramic material, for example, with an isolation or seed layer 96 of desired material such as Ta, for example, formed on the substrate surface below the MR layer 91. During fabrication, the MR layer 91 is deposited in the presence of a magnetic field having a desired orientation to orient the MR layer easy axis in a desired direction. Alternatively, other suitable methods such as annealing in the presence of a magnetic field, for example, as are known in the art can be used to set the easy axis orientation. As is known in the art, additional layers of material such as magnetic shield layers can also be interposed between the MR layer 91 and the substrate 98.

The dimensions of the sensor active region 92 are a function of the data storage density for the magnetic storage system that the MR sensor is designed to be used with. For example, as shown in FIG. 5, for a recording density of about 2 Gb/in$^2$ the active portion of the MR layer 91 will have a track width TW of about 1.0 μm and a stripe height h of about 0.6 μm and a thickness of about 120 Å. The thickness of the antiferromagnetic pinning layer 93 is in the range of about 50 to 300 Å.

The MR sensor 90 is coupled to a current source 99 and signal detection and processing circuitry 97 via leads 95 and 101. The current source 99 provides a sense current to the MR layer 91 active region 92. Output signals generated by the MR sensor in response to an applied magnetic signal as described with reference to FIGS. 1 and 2 are processed in the detection circuitry 97.

The magnetization of the MR layer at the active region or track edges 103 is fixed or "pinned" by exchange coupling to the antiferromagnetic pinning layer 93 to prevent switching or rotation of magnetic moments at the edges 103. To minimize or eliminate magnetic singularities at corners and other geometric discontinuities, the MR layer 91 extends as a continuous film across the sensor active region 92 and the sensor end regions 94.

While the present invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

We claim:

1. A magnetoresistive sensor comprising a layer of ferromagnetic material having planar dimensions defining a generally square shape, said planar dimension being selected to be less than the thickness of the magnetic domain Neel walls in said ferromagnetic layer, the magnetization of said ferromagnetic layer having a predefined orientation at the edges thereof, the anisotropic magnetic axis being oriented at approximately 45 degrees with respect to said ferromagnetic layer's longitudinal axis.

2. A magnetoresistive sensor as in claim 1 wherein said ferromagnetic material is selected from the group consisting of iron, nickel, cobalt and alloys of iron, nickel or cobalt.

3. A magnetoresistive sensor as in claim 2 wherein said ferromagnetic layer is an alloy comprising nickel and iron.

4. A magnetoresistive sensor having end regions separated by a central active region, said central active region being responsive to intercepted magnetic fields for generating a signal representative of resistance changes in said central active region, comprising:

a layer of ferromagnetic material deposited on a substrate and extending over at least said central active region, said ferromagnetic layer in said central active region having planar dimensions defining a generally square shape, said planar dimensions being less than the thickness of the magnetic domain Neel walls in said ferromagnetic layer, the magnetization of said ferromagnetic layer having a predefined orientation at the edges of said central active region, the anisotropic magnetic axis being oriented at approximately 45 degrees with respect to said ferromagnetic layer's longitudinal axis; and electrically conductive leads deposited over said end regions of said magnetoresistive sensor and in contact with said ferromagnetic layer, said conductive leads extending to opposing edges of said central active region, the horizontal dimension of said central active region determined by the edges of said conductive leads.

5. A magnetoresistive sensor as in claim 4 wherein said ferromagnetic material is selected from the group consisting of iron, nickel, cobalt and alloys of iron, nickel or cobalt.

6. A magnetoresistive sensor as in claim 5 wherein said ferromagnetic layer is an alloy comprising nickel and iron.

7. A magnetoresistive sensor as in claim 4 wherein said conductive leads are of an electrically conductive material selected from the group consisting of gold, silver, copper, tantalum, and conductive alloys thereof.

8. A magnetoresistive sensor as in claim 4 wherein said conductive leads each comprise an underlayer of tantalum, a conductive layer of gold-nickel alloy formed on said underlayer and an overlayer of tantalum formed on said conductive layer.

9. A magnetoresistive sensor as in claim 4 further comprising a layer of magnetic bias material extending over only said end regions.

10. A magnetoresistive sensor having end regions separated by a central active region, said central active region being responsive to intercepted magnetic fields for generating a signal representative of resistance changes in said central active region, comprising:

a layer of ferromagnetic material deposited on a substrate and extending over at least said central active region, said ferromagnetic layer in said central active region having planar dimensions defining a generally square shape, said planar dimensions being less than the thickness of the magnetic domain Neel walls in said ferromagnetic layer, the magnetization of said ferromagnetic layer having a predefined orientation at the edges of said central active region, the anisotropic magnetic axis being oriented at approximately 45 degrees with respect to said ferromagnetic layer's longitudinal axis; and a layer of magnetic biasing material deposited over said substrate in said end regions only and in contact with said ferromagnetic layer at least at the edges of said central active region, said magnetic biasing layer for maintaining the magnetization of said ferromagnetic layer in said predefined orientation at the edges of said central active region.

11. A magnetoresistive sensor as in claim 10 further comprising electrically conductive leads deposited over said end regions of said magnetoresistive sensor overlying said magnetic biasing layer, said conductive leads extending to opposing edges of said central active region, the horizontal dimension of said central active region determined by the edges of said conductive leads.

12. A magnetoresistive sensor as in claim 11 further comprising:

current means coupled to said electrically conductive leads for providing a sense current to said magnetoresistive sensor; and circuit means coupled to said current means and said electrically conductive leads for receiving and processing said signal.

13. A magnetoresistive sensor as in claim 11 wherein said conductive leads are of an electrically conductive material selected from the group consisting of gold, silver, copper, tantalum, and conductive alloys thereof.

14. A magnetoresistive sensor as in claim 11 wherein said conductive leads each comprise an underlayer of tantalum, a conductive layer of gold-nickel alloy formed on said underlayer and an overlayer of tantalum formed on said conductive layer.

15. A magnetoresistive sensor as in claim 10 wherein said ferromagnetic material is selected from the group consisting of iron, nickel, cobalt and alloys of iron, nickel or cobalt.

16. A magnetoresistive sensor as in claim 15 wherein said ferromagnetic layer is an alloy comprising nickel and iron.

17. A magnetoresistive sensor as in claim 10 wherein said magnetic biasing layer is of antiferromagnetic material.

18. A magnetoresistive sensor as in claim 17 wherein said antiferromagnetic material is selected from the group consisting of manganese-iron and nickel-manganese.

19. A magnetoresistive sensor as in claim 10 wherein said magnetic biasing layer is of a hard magnetic material.

20. A magnetoresistive sensor as in claim 19 wherein said hard magnetic material is selected from the group consisting of cobalt-nickel, cobalt-platinum, cobalt-nickel-chromium and cobalt-platinum-chromium.

21. A magnetic storage system comprising:

a magnetic storage medium having a plurality of tracks for recording of data;

a magnetic transducer maintained in a closely spaced position relative to said magnetic storage medium during relative motion between said magnetic transducer and said magnetic storage medium, said magnetic transducer including a magnetoresistive sensor formed on a substrate and having passive end regions separated by a central active region, comprising:

a layer of ferromagnetic material extending over at least said central active region, said ferromagnetic layer in said central active region having planar dimensions defining a generally square shape, said ferromagnetic planar dimensions being less than the thickness of the magnetic domain Neel walls in said ferromagnetic layer, the magnetization of said ferromagnetic layer having a predefined orientation at the edges of said central active region, the anisotropic magnetic axis being oriented at approximately 45 degrees with respect to said ferromagnetic layer's longitudinal axis;

a layer of magnetic biasing material deposited over said substrate in said end regions only and in contact with said ferromagnetic layer at least at the edges of said central active region, said magnetic biasing layer for maintaining the magnetization of said ferromagnetic layer in said predefined orientation at the edges of said central active region; and electrically conductive leads deposited over said end regions of said magnetoresistive sensor overlying said magnetic biasing layer, said conductive leads extending to opposing edges of said central active region, the horizontal dimension of said central active region determined by the edges of said conductive leads actuator means coupled to said magnetic transducer for moving said magnetic transducer to selected tracks on said magnetic storage medium; and means coupled to said magnetoresistive sensor for detecting resistance changes in said magnetoresistive material responsive to magnetic fields representative of data bits recorded in said magnetic storage medium intercepted by said magnetoresistive sensor.

22. A magnetic storage system as in claim 21 wherein said ferromagnetic material is selected from the group consisting of iron, nickel, cobalt and alloys of iron, nickel or cobalt.

23. A magnetic storage system as in claim 22 wherein said ferromagnetic layer is an alloy comprising nickel and iron.

24. A magnetic storage system as in claim 21 wherein said conductive leads are of an electrically conductive material selected from the group consisting of gold, silver, copper, tantalum, and conductive alloys thereof.

25. A magnetic storage system as in claim 21 wherein said conductive leads each comprise an underlayer of tantalum, a conductive layer of gold-nickel alloy formed on said underlayer and an overlayer of tantalum formed on said conductive layer.

26. A magnetic storage system as in claim 21 wherein said magnetic biasing layer is of antiferromagnetic material.

27. A magnetic storage system as in claim 26 wherein said antiferromagnetic material is selected from the group consisting of manganese-iron and nickel-manganese.

28. A magnetic storage system as in claim 21 wherein said magnetic biasing layer is of a hard magnetic material.

29. A magnetic storage system as in claim 28 wherein said hard magnetic material is selected from the group consisting of cobalt-nickel, cobalt-platinum, cobalt-nickel-chromium and cobalt-platinum-chromium.

30. A method for fabricating a magnetoresistive sensor of the type having passive end regions separated by a central active region, said central active region being responsive to intercepted magnetic fields for generating a signal representative of resistance changes in said central active region, said method comprising the steps of:

depositing a layer of magnetoresistive ferromagnetic material on a substrate over at least said central active region, said ferromagnetic layer in said central active region having planar dimensions defining a generally square shape, said ferromagnetic planar dimensions being less than the thickness of the magnetic domain Neel walls in said ferromagnetic layer, the magnetization of said ferromagnetic layer having a predefined orientation at the edges of said central active region;

depositing a layer of antiferromagnetic material on said substrate over said end regions only and in direct contact with said magnetoresistive layer at least at opposing edges of said central active region;

annealing said deposited ferromagnetic and antiferromagnetic layers in the presence of a magnetic field for orienting the magnetic easy axis of said ferromagnetic layer in a predefined direction.

* * * * *